(12) United States Patent
Schwarzbauer

(10) Patent No.: US 6,823,915 B2
(45) Date of Patent: Nov. 30, 2004

(54) HEAT-CONDUCTING ADHESIVE JOINT WITH AN ADHESIVE-FILLED, POROUS HEAT CONDUCTOR

(75) Inventor: Herbert Schwarzbauer, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/220,147

(22) PCT Filed: Jan. 9, 2001

(86) PCT No.: PCT/DE01/00054
§ 371 (c)(1),
(2), (4) Date: Aug. 27, 2002

(87) PCT Pub. No.: WO01/65603
PCT Pub. Date: Sep. 7, 2001

(65) Prior Publication Data
US 2003/0020159 A1 Jan. 30, 2003

(30) Foreign Application Priority Data
Feb. 29, 2000 (DE) .......................... 100 09 678

(51) Int. Cl.⁷ .......................... B32B 31/00; G05G 15/00
(52) U.S. Cl. .......................... 156/349; 257/706; 257/707
(58) Field of Search .................. 257/705, 787, 257/706, 707; 156/1, 78, 349, 307.3

(56) References Cited

U.S. PATENT DOCUMENTS

| | | | | |
|---|---|---|---|---|
| 4,810,672 A | * | 3/1989 | Schwarzbauer | 437/209 |
| 4,965,660 A | | 10/1990 | Ogihara et al. | |
| 5,492,623 A | * | 2/1996 | Ishibe | 210/232 |
| 5,654,586 A | * | 8/1997 | Schwarzbauer | 257/701 |
| 5,904,796 A | * | 5/1999 | Freuler et al. | 156/278 |
| 5,985,213 A | * | 11/1999 | Nakajima et al. | 422/53 |
| 6,093,476 A | * | 7/2000 | Horiuchi et al. | 428/209 |
| 6,113,730 A | * | 9/2000 | Ohya et al. | 156/307.3 |
| 6,453,899 B1 | * | 9/2002 | Tselesin | 125/15 |

FOREIGN PATENT DOCUMENTS

| | | | | |
|---|---|---|---|---|
| EP | 0 242 626 | | 10/1987 | |
| JP | 54-106173 | * | 8/1979 | .......... H01L/23/40 |
| JP | 03 217048 | | 9/1991 | |
| JP | 09162336 | | 6/1997 | |
| JP | 11 354692 | | 12/1999 | |
| JP | 11-354692 | * | 12/1999 | .......... H01L/23/29 |
| WO | 95 11798 | | 5/1995 | |
| WO | WO 02/085339 | * | 10/2002 | ............ A61K/9/72 |

OTHER PUBLICATIONS

Merriam–Webster Online.*
Gent et al., Spontaneous Adhesion of Silicone Rubber, 1982; Journal of Applied Polymer Science, vol. 27, pp. 4357–4363.*

* cited by examiner

Primary Examiner—Mary Wilczewski
Assistant Examiner—Monica Lewis
(74) Attorney, Agent, or Firm—Young & Thompson

(57) ABSTRACT

A heat-conducting adhesive compound is provided with a sintered layer (3) that consists of heat-conducting power, is arranged between two workpieces and contacts each workpiece in a two-dimensional manner. The compound is also provided with an adhesive (4') which fills openings (33) on the surface (31) of the layer and adheres to the two workpieces. In a preferred embodiment, the sintered layer consists of silver powder. The sintered layer is produced between the workpieces and the layer is subsequently filled with a liquid adhesive (4) which is then hardened.

13 Claims, 3 Drawing Sheets

HEAT-CONDUCTING ADHESIVE JOINT WITH AN ADHESIVE-FILLED, POROUS HEAT CONDUCTOR

FIELD OF THE INVENTION

The invention relates to a heat-conducting adhesive joint between two workpieces and a method for producing a heat-conducting adhesive joint between two work-pieces.

BACKGROUND OF THE INVENTION

Electronic components, in particular power semiconductor components such as IGBTs, MOS-FETs, diodes, thyristors and so on produce high power losses during operation, which have to be dissipated efficiently in order not to exceed the maximum operating temperature.

For semiconductor chips up to at most 2×2 cm in size, soft soldering with tin, lead and their alloys on supporting elements made of ceramic or metal has become completely widespread in the technology. Other methods, such as those with gold solders, glass pastes and so on have found only a very narrow field of use, for cost reasons.

Development trends are leading, on one hand, to ever higher operating temperatures until close to the melting points of the solders, with the reliability increased at the same time, but on the other hand lead should be superseded for environmental protection reasons, in particular also by law.

Adhesive bonding, which is otherwise very common in chip assembly technology, suffers from poor thermal conductivity and also poor electrical conductivity of the adhesives.

This poor thermal conductivity of the adhesives can be improved by means of particles which conduct heat well and which are suspended in the poorly conducting adhesive. For example, DE-A-195 29 627 (95P1762 DE) discloses improving the thermal conductivity of the adhesive by adding a heat-conducting powder, for example nickel powder.

In practical terms, this document describes a heat-conducting, electrically insulating adhesive joint between two workpieces, said joint having a layer of ceramic material and a layer of adhesive.

The layer of ceramic material has two flat surfaces which face away from each other and, on each flat surface, there are openings defined by voids in the layer, and the layer is arranged between the two workpieces in such a way that one of the two flat surfaces of one of the two workpieces, which is constructed in the form of a heat sink, has flat contact made with it. Furthermore, at least the openings on the other flat surface, which faces away from the one flat surface, is filled with electrically insulating material.

The layer of adhesive is arranged between the layer of ceramic material and the other workpiece, which forms an electronic power component, and has two flat surfaces that face away from each other. One of these surfaces makes flat contact with the other workpiece and adheres to the latter. The other surface makes flat contact with the other flat surface of the layer of ceramic material and adheres to said layer.

In order to improve the thermal conductivity of the layer of adhesive, a heat-conducting powder, for example nickel powder, is added to said layer.

This known adhesive joint is produced as follows:

The ceramic layer is produced on one workpiece by means of thermal spraying, the openings defined by voids in the layer being produced automatically on the flat surfaces of this layer.

At least the openings on the other flat surface facing away from the one flat surface and the one workpiece are filled with electrically insulating material.

The layer of the ceramic material which comprises the electrically insulating material is joined to the other workpiece by means of the adhesive layer to which the heat-conducting powder is added.

DE 34 14 065 A1 (84 P 1304) and EP 0 242 626 A2 (86 P 1242) in each case reveal a different type of adhesive-free joint between a workpiece in the form of an electronic component and a workpiece in the form of a substrate, which has a layer of heat-conducting material in the form of a sintered metal powder and is therefore both thermally conductive and electrically conductive.

The layer of the sintered metal powder has two flat surfaces which face away from each other and each of which has openings defined by voids in this layer.

The layer is arranged between the two workpieces in such a way that one of the two flat surfaces is sintered onto one of the two workpieces and the other flat surface is sintered onto the other workpiece.

The sintered metal powder of the layer is coherent from one of the flat surfaces in the direction of the other flat surface.

The production of the adhesive-free joint according to DE 34 14 065 A1 is carried out by the following steps:

A paste is applied to one workpiece and/or the other workpiece, said paste being composed of a mixture of a metal powder which can be sintered at a specific sintering temperature and a liquid.

The two workpieces are brought together in such a way that the paste is located between the two workpieces and makes contact with both workpieces.

The paste is dried and the dried powder is sintered by heating to the sintering temperature. This sintering is carried out in a non-oxidizing atmosphere, for example $N_2$ or $H_2$, and the sintering temperature in this case is about 400° C. During the sintering operation, a mechanical pressure, for example 80 to 90 $N/cm^2$, can be exerted.

The production of the adhesive-free joint according to EP 0 242 626 A2 is carried out by the following steps:

A paste is applied to a workpiece, said paste being composed of a mixture of a metal powder that can be sintered at a specific sintering temperature and a liquid.

The paste is dried.

The other workpiece is placed on the dried powder.

The entire arrangement is then heated to sintering temperature with the simultaneous exertion of a mechanical pressure of at least 900 $N/cm^2$. The sintering temperature is about 230° C. to 250° C.

In the thesis by Sven Klaka: "Eine Niedertemperatur-Verbindungstechnik zum Aufbau von Leistungshalbleitermodulen" [A low-temperature joining technique for the assembly of power semiconductor modules], Cuvillier Verlag, Göttingen 1997, in this connection the sintering operation in the case of silver powder is examined at low sintering temperatures between 100° C. and 250° C. and it is established that this powder can form sintered bridges between 200° C. and 250° C.

SUMMARY OF THE INVENTION

The invention is based on the object of providing a heat-conducting adhesive joint between two workpieces which exhibits a higher thermal conductivity than a joint with a layer of adhesive to which a heat-conducting powder is added.

This object is achieved by the features of claim 1.

According to said claim, the heat-conducting adhesive joint according to the invention comprises:

a layer of heat-conducting material,
which has two flat surfaces facing away from each other,
which, on each flat surface, has openings defined by voids in the layer,
which is arranged between the two workpieces in such a way that one of the two flat surfaces (31) makes flat contact with one of the two workpieces, and the other flat surface makes flat contact with the other workpiece, and
whose heat-conducting material is coherent from one of the flat surfaces in the direction of the other flat surface, and an adhesive
which fills the openings in the layer and
which adheres to both workpieces.

The term "coherent" is to be understood in such a way that, in the layer of heat-conducting material, this material coheres from one of the flat surfaces in the direction of the other flat surface of the layer outside the voids of this layer, or forms a unit, at least in such a way as in the case of a layer of sintered powder of heat-conducting material. Such coherence, beneficial for the thermal conductivity, is not present in a thermally and electrically poorly conducting layer of adhesive to which heat-conducting powder is added, since heat-conducting paths are formed in this layer only at comparatively few points of contact between the particles of the added powder.

The higher the thermal conductivity of the heat-conducting material of the layer, the more beneficial this is for the heat-conducting adhesive joint according to the invention.

One advantage of the adhesive joint according to the invention is that it can be implemented as desired as an electrically conductive or electrically insulating joint, depending on whether the heat-conducting material selected for the layer is electrically conductive, for example metal, or electrically insulating, for example heat-conducting ceramic material.

The strength of the adhesive joint according to the invention is advantageously composed of the inherent strength of the layer of heat-conducting material and the strength of the adhesive, can therefore become significantly greater than in the case of an adhesive joint of pure adhesive or adhesive to which powder of heat-conducting material is added. At high temperatures, the strength of the layer of heat-conducting material generally dominates. The adhesive advantageously protects the layer of heat-conducting material, in particular at high temperatures, against reaction of the layer with oxygen or another oxidizing gas.

In principle, it is sufficient if the layer of heat-conducting material has only voids which define openings on the flat surfaces of the layer. For example, the layer can be a film of heat-conducting material with holes, each of which defines one opening on both flat surfaces of the layer.

The layer of the heat-conducting material is preferably interspersed in the manner of a sponge with voids, so that there are also voids in the interior of the layer which do not immediately adjoin the flat surfaces of the layer and do not define any openings on these surfaces.

In this case, it is advantageous if at least those voids in the layer which define openings on one flat surface of the layer are joined to one another. Through these voids, curable liquid adhesive can be introduced in a simple way from the outside into the openings on one flat surface of the layer, even if this surface is already in contact with a workpiece.

It is beneficial if as far as possible all the available voids are connected to one another, and, in relation to the curable liquid adhesive, are so small that, for this adhesive, they act like capillaries which exert a suction action on said adhesive. In this case, the curable liquid adhesive can advantageously substantially be introduced automatically from the outside through the layer and into the openings on the flat surfaces of this layer by means of capillary suction action, irrespective of whether the surfaces are already in contact with a workpiece or not. As an alternative or in addition to the capillary suction action, the curable liquid adhesive can be introduced into the layer with support from pressure.

In a preferred embodiment of the joint according to the invention, the heat-conducting material of the layer is selected from the group of metals, in particular from the group of noble and semi-noble metals. It is particularly advantageous here for the heat-conducting material to comprise silver.

The layer is preferably and advantageously composed of sintered metal powder. Such a layer, which is electrically conductive, has the following advantages, for example: it can be produced easily, under certain circumstances it can be sintered onto a workpiece or onto both workpieces to be joined and, on its own, can already form a heat-conducting joint to one or both workpieces, which assists the joint produced by the adhesive and is inherently formed in such a way that it has openings defined by voids on its flat surfaces and is interspersed in the manner of a sponge with voids, the voids being connected to one another and, in relation to a curable liquid adhesive, being capable of being so small that they exert a capillary suction action on this adhesive, and so on.

The adhesive joint according to the invention is particularly well suited for fixing an electronic component, in particular a power component, to a supporting element, that is to say, in the case of this joint, one workpiece is the electronic component, in particular the power component, and the other workpiece is the supporting element for the electronic component. The supporting element preferably comprises a heat sink for the electronic component.

The invention also provides a method for producing a heat-conducting adhesive joint between two workpieces, which has a higher thermal conductivity than a joint with a layer of adhesive to which a heat-conducting powder is added, and which comprises the steps of:

producing a layer of heat-conducting material,
which has two flat surfaces facing away from each other,
which, on each flat surface, has openings defined by voids in the layer,
which is arranged between the two workpieces in such a way that one of the two flat surfaces makes flat contact with one of the two workpieces, and the other flat surface makes flat contact with the other workpiece in each case, and
whose heat-conducting material is coherent from one of the flat surfaces in the direction of the other flat surface, introducing liquid curable adhesive into the openings in the layer arranged in this way between the two workpieces, such that the liquid adhesive introduced wets each workpiece and curing the adhesive introduced in this way.

According to this method, first of all a highly thermally conductive layer is produced which is in contact with both workpieces, and only then is the layer bonded adhesively to the workpieces.

The heat-conducting layer is preferably and advantageously produced by the steps of:

applying a paste to a workpiece and/or the other workpiece, said paste being composed of a mixture of a powder of heat-conducting material that can be sintered at a specific sintering temperature and a liquid, bringing the two workpieces together in such a way that the paste is located between the two workpieces and makes contact with both workpieces, drying the paste and sintering the dried powder by heating to the sintering temperature.

The layer of sintered powder can advantageously be electrically conductive or nonconductive, depending on the selected heat-conducting material of the powder and, moreover, can have the same advantages as are described above in relation to the layer of sintered metal powder, that is to say it can be produced easily, under certain circumstances it can be sintered onto one workpiece or onto both workpieces to be joined and, on its own, can already form a heat-conducting joint with one or both workpieces, which assists the joint produced by the adhesive, it is inherently formed in such a way that it has openings defined by voids on its flat surfaces and is interspersed in the manner of a sponge with voids, the voids being connected to one another and, in relation to a curable liquid adhesive, being capable of being so small that they exert a capillary suction action on this adhesive, and so on.

A higher density and therefore higher thermal conductivity of the sintered layer of the heat-conducting powder can be obtained if very much finer and/or very much coarser powder made of heat-conducting material is added to the powder. Coarse-grained powder can be composed of metal or other substances with a good thermal conductivity, for example of SiC or diamond.

A high density and therefore good thermal conductivity of the sintered layer of heat-conducting material can also be achieved with the step of exerting a specific mechanical pressure on the powder during the sintering operation or after the completion of this operation.

Use is preferably made of a sinterable powder selected from the group of metals, in particular of the noble and semi-noble metals.

It is particularly advantageous to make use of a sinterable powder comprising silver. If use is made of a powder comprising silver particles, and the sintering of this powder is carried out in an oxidizing atmosphere, a sintering temperature between 100° C. and 250° C. is advantageously adequate for sintering. The sintering in an oxidizing atmosphere can also be advantageous in the case of sinterable powders which contain substances differing from silver.

BRIEF DESCRIPTION OF THE DRAWING

The invention will be explained in more detail by way of example in the following description, by using the drawings, in which.

The figures are schematic and not to scale.

DETAILED DESCRIPTION OF THE INVENTION

The heat-conducting adhesive joint according to the invention between two workpieces will be explained in more detail using the example of a preferred specific production method.

Figure 1:
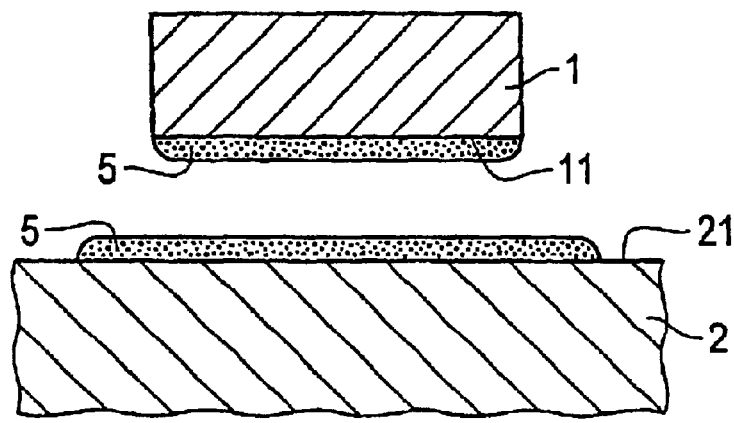
FIG. 1 shows two separate workpieces in cross section, to which in each case a paste composed of a sinterable heat-conducting material and a liquid is applied.

FIG. 1 shows, as the initial stage of this method, two workpieces 1 and 2 which are separated from each other and have mutually opposite and mutually shape-adapted, for example flat, surface sections 11 and 21, respectively.

For example, let the workpiece 1 be an electronic component, for example a power component, in particular a power semiconductor component, and let the workpiece 2 be a supporting element for the electronic component which, in particular, can be a heat sink for this element or at least comprise such a heat sink.

Applied to the surface section 21 of the workpiece 2 and/or the surface section 11 of the workpiece 1 is a paste 5, which is composed of a mixture of a powder of heat-conducting material that can be sintered at a specific sintering temperature T and a liquid. In FIG. 1, the paste 5 is shown as applied to each workpiece 1 and 2, but it is also sufficient to apply the paste 5 to only one workpiece, for example the workpiece 2.

Figure 2:
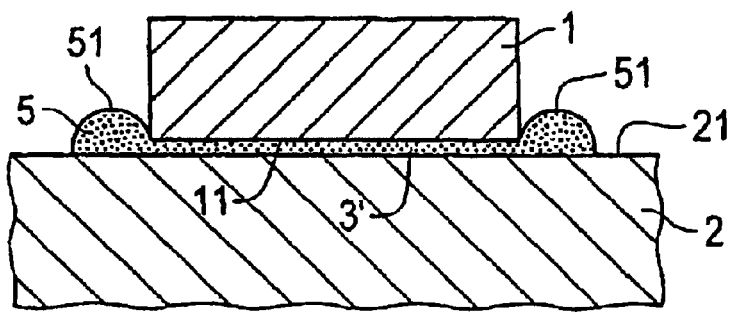
FIG. 2 shows the workpieces from FIG. 1 in the same representation but in the state in which they are brought together in such a way that the paste forms a single continuous layer between the workpieces and making contact with both workpieces.

Following the application of the paste 5, the two workpieces 1 and 2 are brought together in such a way that the paste 5 is located between the two workpieces 1 and 2, and the paste 5 makes contact as far as possible with the entire area of the surface section 11 and 21 of each workpiece 1 and 2 and forms a thin layer 3' between these sections 11 and 21, after which the intermediate stage of the method illustrated in FIG. 2 has been produced.

The layer of the paste 5 is then dried and sintered after heating to the sintering temperature T.

For the drying of the paste 5 and also the subsequent introduction of curable liquid adhesive into the sintered layer, it is advantageous if the two workpieces 1 and 2 that have been brought together are pressed against each other, so that the paste 5 flows out of at least one workpiece, for example the workpiece 1, in a small bead 51, which surrounds this workpiece.

The drying of the paste 5 is carried out for example by permitting the liquid contained in the paste 5 to evaporate, which can be performed by heating the paste 5, for example during heating to sintering temperature T, and/or at a negative pressure, for example in vacuum. The bead 51 advantageously contributes to the liquid being able to evaporate without residue and without forming bubbles.

Figure 3:
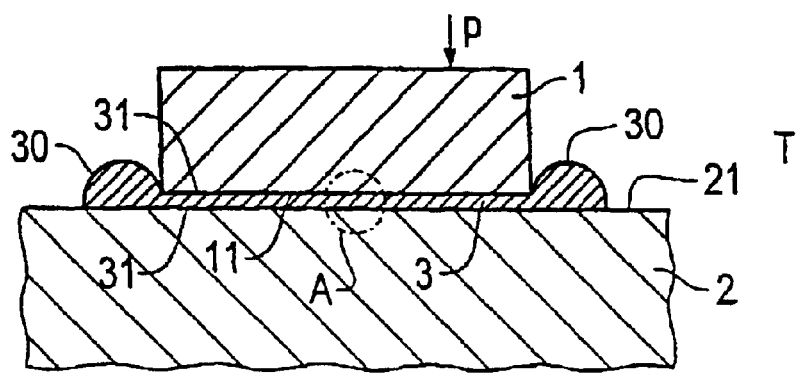
FIG. 3 shows the workpieces from FIG. 2 in the same representation but following the drying of the paste and the sintering of the powder of heat-conducting material to form a sintered layer, which is arranged between the workpieces and makes contact with both workpieces.

Following the sintering of the dried powder, the intermediate stage of the method illustrated in FIG. 3 has been produced.

This intermediate stage has the sintered layer 3 of dried powder arranged between the surface sections 11 and 21 of the workpieces 1 and 2, said layer having two flat surfaces 31, 31 that face away from each other and a bead 30 which surrounds at least one workpiece and has been produced from the bead 51.

One of the flat surfaces 31, 31 adjoins the surface section 11 of the workpiece 1 in a flat manner, the other adjoins the surface section 21 of the workpiece 2 in a flat manner.

In order to increase the density of the sintered layer 3, a specific mechanical pressure p can be exerted on the powder between the workpieces 1 and 2 during the sintering operation.

The sintering temperature T is determined by the powder material.

Figure 4:
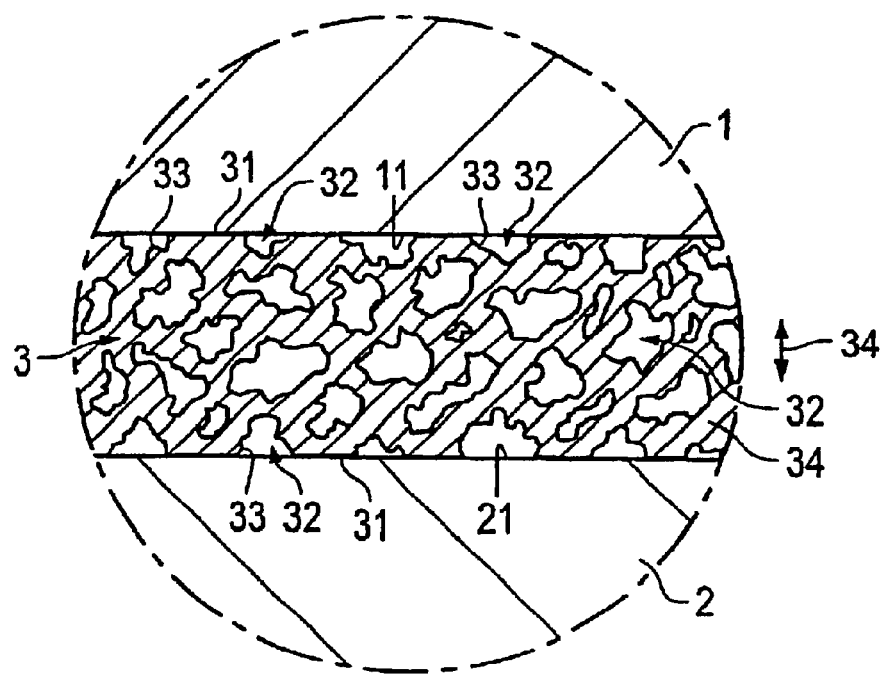
FIG. 4 shows the detail A enclosed by a circle in FIG. 3 in an enlarged representation.

The detail A of FIG. 3 represented in enlarged form in FIG. 4 shows the structure of the sintered layer 3 by way of example and schematically.

In FIG. 4, the obliquely hatched part 34 of the layer 3 contains sintered powder of heat-conducting material, which is coherent from one flat surface 31 in the direction 35 of the other flat surface 31 of the layer 3.

All the unhatched white areas 32 of the layer 3 represent voids in the layer 3. Although all these white areas would in each case have to be provided with the reference symbol 32, for clarity only a few of these areas have been designated with this reference symbol 32.

The voids 32 are interspersed through the layer 3 in the manner of a sponge and, for the major part, are connected to one another even if not in the section plane illustrated. Voids 32 which adjoin a flat surfaces 31 in each case define an opening 33 in this surface 31.

The method described up to this point is similar to the method described in DE 34 14 065 A1 for producing an adhesive-free joint, and also the method described in EP 0 242 626 A2 for producing such a joint, and all the workpieces and materials for these workpieces which are specified there, the liquid of the paste and the powder of the paste, and also the sintering temperatures and pressures specified there, can also be used in the method described here for producing the adhesive joint according to the invention. The entire disclosure of DE 34 14 065 A1 and the entire disclosure of EP 0 242 626 A2 form a constituent part of the present application.

In the method disclosed by these two documents, the sintered layer is composed of metal and is sintered onto both workpieces. In addition, use can be made of a sinterable powder selected from the group of metals for producing the layer 3 according to the invention. In particular, use can be made of a sinterable powder selected from the group of noble and semi-noble metals. Such a layer 3 can be sintered onto the workpiece 1 and/or 2. Use can advantageously also be made of sinterable powders which do not sinter onto a workpiece 1 and/or 2. The layer 3 can also be produced with a heat-conducting nonmetallic sinterable powder, for example a powder comprising ceramic material, SiC, diamond and so on.

It is beneficial if the surface section 11 or 21 of a workpiece 1 and/or 2 is smooth, in particular polished, since in this case the particles of the sintered layer 3 come into particularly close contact with the relevant surface section 11 or 21 and ensure good heat transfer between workpiece 1 and/or and sintered layer 3.

The openings 33 on the flat surfaces 31 of the sintered layer 3 arranged between the workpieces 1 and 2 are then filled with curable liquid adhesive, which wets the surface sections 11 and 21 of the workpieces 1 and 2.

On account of the structure of the layer 3, interspersed in the manner of a sponge with voids 32 that are connected to one another, the filling of the openings 33 with liquid adhesive can be carried out by sucking this adhesive into the layer 3 until as far as possible all the voids 32 and openings 33 are filled with the adhesive.

Sucking the adhesive in can be carried out by means of capillary action of the interconnected voids 32 on the liquid adhesive and/or assisted by pressure. It is beneficial if the adhesive is as thin a liquid as possible.

Liquid epoxy resin, for example, in suitable as a curable liquid adhesive 4.

The bead 30 is advantageous for the action of sucking the adhesive into the layer 3, since it provides a relatively large area to the adhesive to be sucked in.

Figure 5:
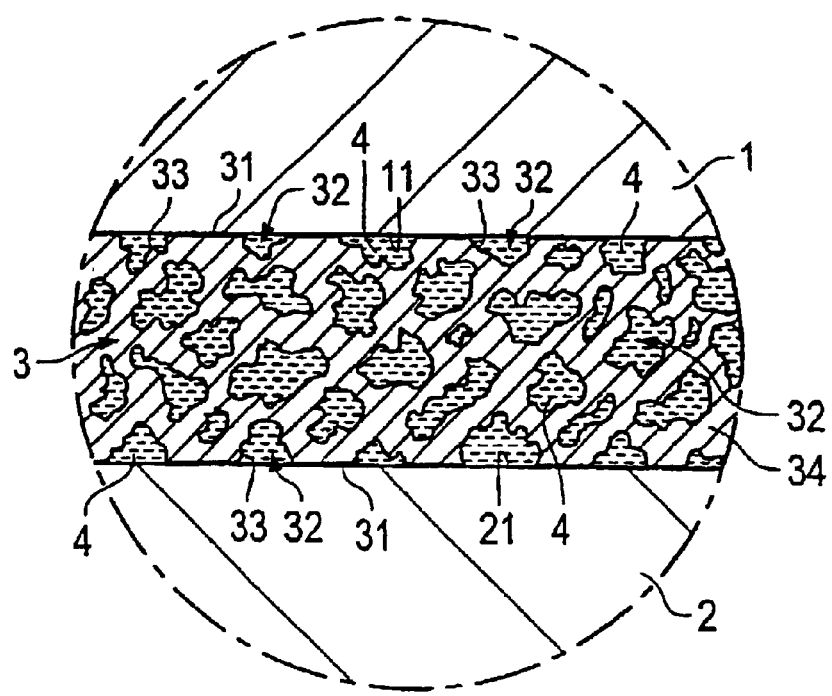
FIG. 5 shows the detail A from FIG. 4 following the filling of the openings and voids in the sintered layer with curable liquid adhesive.

Following such filling of the openings 33 in the layer 3, an intermediate method stage has been produced which is represented in FIG. 5 which, like FIG. 4, shows the detail A from FIG. 3 enlarged. The adhesive sucked into the layer 3 and filling the voids 32 and openings 33 in the layer 3 is indicated by dashed horizontal lines in FIG. 5 and designated by 4. In the openings 33, the adhesive 4 wets the surface sections 11 and 21 of the workpieces 1 and 2.

Figure 6:
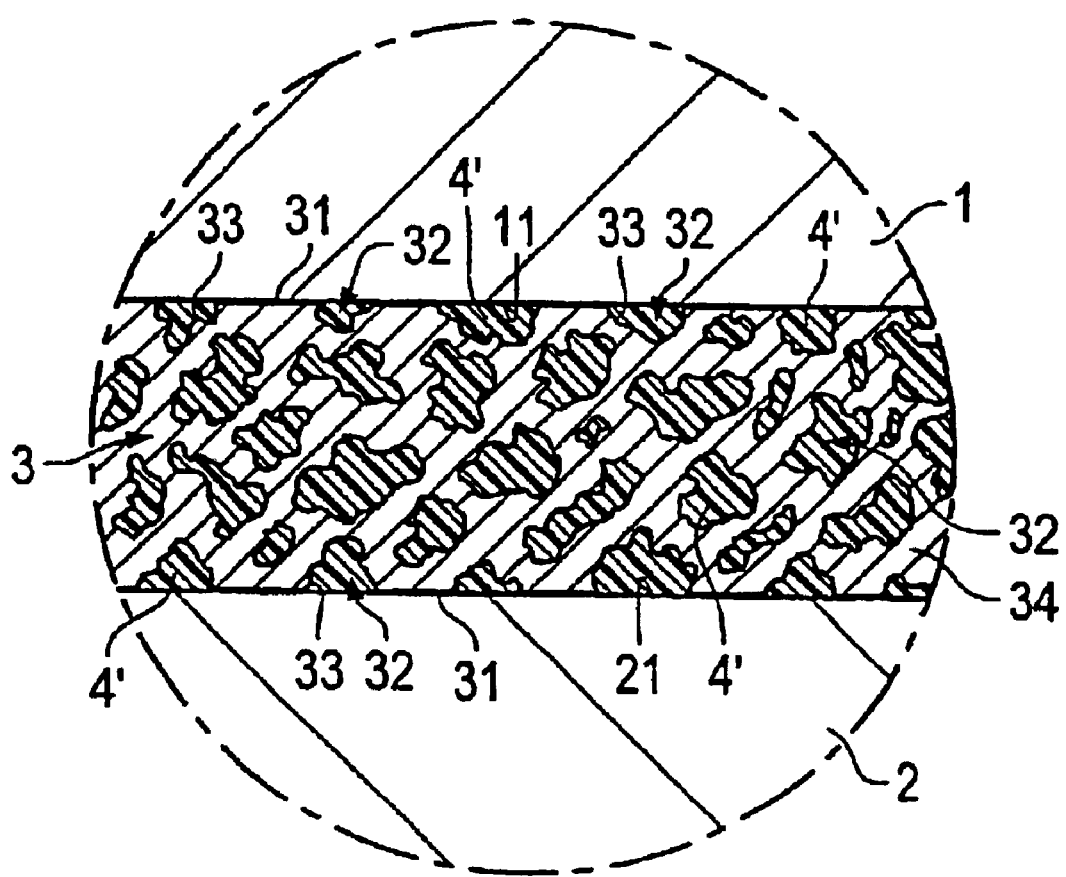
FIG. 6 shows the detail A from FIG. 5 following the curing of the adhesive.

Following the curing of the adhesive 4 sucked in, the finished adhesive joint according to the invention has been produced, and is represented in FIG. 6 which, like FIGS. 4 and 5, shows the detail A from FIG. 3 enlarged. The cured adhesive filling the voids 32 and openings 33 in the layer 3 is indicated in FIG. 6 as hatched obliquely and alternately thin and thick and is designated by 4'. In the openings 33, the cured adhesive 4' adheres to the surface sections 11 and 21 of the workpieces 1 and 2.

A particularly preferred embodiment of the adhesive joint according to the invention comprises a layer 3 of sintered silver powder, which is particularly suitable for the above-described method for producing this adhesive joint since, according to the thesis mentioned above, silver is able to form sintered bridges even at low temperatures between 100° C. and 250° C., preferably between about 150° C. and 250° C.

In order to produce this adhesive joint, for example suitable fine-grained silver powder is stirred with a liquid, for example an organic liquid, such as terpineol or ethylene glycol ether, to form a paste 5 which can be processed like a conductive adhesive paste.

Following application of the paste 5, for example by a dispenser, to at least one of the two workpieces 1 or 2, which is, for example, a supporting element for an electronic component in the form of a chip, the other workpiece 2 or 1, the chip in the example, is placed on the paste 5 in such a way that it flows out all around in a small bead 51. Then, during slow heating of the paste 5, the liquid can evaporate without residue and without forming bubbles, and the paste 5 can dry.

Following the drying, a layer 3 and a bead 30 of dried silver powder have been produced between the workpieces 1 and 2 and are sintered.

For sintering silver at less than 250° C., an oxidizing atmosphere is imperative. Surprisingly, in the thin layer 3 of silver powder of less than 100 $\mu$m between the workpieces 1 and 2, the oxygen is able to penetrate in sufficiently quickly so that, even in areas of up to 5×5 cm$^2$ or more, sintering of the silver powder takes place. For example, in areas of 2×2 cm², sintering of the silver powder takes place within about 15 minutes.

The finding has been made that, in an $O_2$-containing atmosphere, for example in air, silver powder surprisingly begins to sinter even at low temperatures from 150° C. In this case, the sintering process manifests itself in that the silver powder solidifies to form a foam with voids and achieves a striking adhesive capacity. For example, a hot tip of a pair of forceps adheres to the solidified sponge of silver powder under slight pressure. This adhesion also occurs on many smooth surfaces, such as silicon, glass, corundum, polyimide, and is sufficiently strong for example to sinter a chip onto glass and to cool it down to room temperature, to suck in curable liquid adhesive and, for example, for the purpose of wire bonding. It is also true of silver that polished surfaces are particularly suitable for this purpose, since the silver particles come into close contact with the surface. At high temperature, the adhesive capacity falls off again.

The sintered layer 3 of silver powder produced in this way is interspersed in the manner of a sponge with voids 32 and has openings on its flat surfaces 31. Depending on the initial powder, the density of this layer 3 is between 40–50% by volume of silver and can be increased further by adding very much finer and also very much coarser powder. Instead of silver, other substances with good thermal conductivity but a low thermal coefficient of expansion can be used as the coarse-grain powder, such as SiC or diamond, for example in order to better match the coefficient of thermal expansion of the sintered layer 3 of silver powder to a chip.

A high silver density and therefore good thermal conductivity can also be achieved by applying pressure at 150° C. to 250° C., it being possible for pressure and time to remain far lower than in the known method according to EP 0 242 626 A2.

The sintered layer 3 of silver powder exhibits a high capillary suction force, so that any thin liquid adhesive 4 can be sucked into the layer 3 or can be pressed with pressure support.

The strength of the adhesive joint following the curing of the adhesive 4 sucked in is then composed of the inherent strength of the sintered layer 3 of silver powder and that of the cured adhesive 4', that is to say can also become significantly greater than that of a pure adhesive bond. At high temperatures, the strength of the sintered layer 3 of silver powder dominates. Since, following the curing of the adhesive 4, the further ingress of oxygen into the sintered layer 3 of silver powder is prevented, the sintered structure of this layer 3 advantageously then no longer changes at high temperatures.

The adhesive joint according to the invention can also be produced differently. For example, a layer 3 of heat-conducting material, for example metal, can be used which has voids 32 in the form of holes, each of which passes through the layer 3 from one flat surface 31 of the layer 3 to the other and which is applied with one of the two flat surfaces 31, 31 of this layer 3 flatly to the surface section 11 or 21 of one of the two workpieces 1 and 2.

Each hole 32 defines an opening 33 in each case in each of the two flat surfaces 31, 31.

This layer 3 can be, for example, a thin film of heat-conducting material, for example metal, applied flat to the surface section 11 or 21 of one of the two workpiece 1 and 2 and having the holes 32 and openings 33 from the beginning.

Instead of the thin film, use can also be made of a layer 3 of heat-conducting material which is applied to the surface section 11 or 21 of one of the two workpiece 1 or 2 by vapor deposition, sputtering, thermal spraying and so on of the surface section 11 or 21, and in which the holes 32 and openings 33 are then produced, for example photolithographically and by etching the layer 3 with an etchant.

The holes 32 and openings 33 in the layer 3 applied are filled with curable liquid adhesive 4 through the flat surface 31 of the layer 3 that faces away from the surface section 11 or 21 of the one workpiece 1 or 2, said adhesive wetting the surface section 11 or 21 of the one workpiece 1 or 2.

The surface section 21 or 11 of the other workpiece 2 or 1 is placed flat on the flat surface 31, of the layer 3 that is filled with the liquid adhesive 4, that faces away from this surface section 11 or 21 of the one workpiece 1 or 2, so that the liquid adhesive 4 wets this surface section 21 or 11.

The adhesive 4 is then cured, so that it adheres to the two surface sections 11 and 21 of the two workpieces 1 and 2.

What is claimed is:

1. A heat-conducting adhesive joint that holds two workpieces together, the joint comprising:
    a layer of heat-conducting sintered metal powder which has two flat surfaces facing away from each other and openings defined by voids throughout the layer, and which is arranged between the two workpieces in such a way that one of the two flat surfaces makes contact with one of the two workpieces and that the other flat surface makes flat contact with the other workpiece wherein the heat-conducting sintered metal powder is coherent from one of the flat surfaces to the other flat surface, and
    an adhesive, which fills the openings in the layer and which is adhered to both workpieces to hold the two workpieces together.

2. The joint as claimed in claim 1, wherein the voids are interspersed throughout the layer in the manner of a sponge.

3. The joint as claimed in claim 1, wherein at least those voids in the layer which define openings on one flat surface of the layer are joined to one another.

4. The joint as claimed in claim 1, wherein the heat-conducting sintered metal powder is selected from the group of noble and semi-noble metals.

5. The joint as claimed in claim 4, wherein the heat-conducting sintered metal powder comprises silver.

6. The joint as claimed in claim 1, wherein one of the workpieces is electronic component and the other of the workpieces is a supporting element for the electronic component.

7. The joint as claimed in claim 6, wherein the electronic component is a power component.

8. The joint as claimed in claim 6, wherein the supporting element comprises a heat sink for the electronic component.

9. A heat-conducting adhesive joint that holds two workpieces together, the joint comprising:
    a layer of a sintered heat-conducting metal powder that extends coherently from one surface of the joint to an opposite surface thereof, said layer having plural interconnected voids throughout, including in the surfaces of the joint, that are connected to each other; and
    an adhesive that fills said plural voids, including said voids in the surfaces of the joint, so that said adhesive extends continuously from the one surface of the joint to the opposite surface thereof, said adhesive being adhered to both of the two workpieces to hold the two workpieces together.

10. The joint of claim 9, wherein said layer of sintered heat-conducting powder is homogeneous.

11. The joint of claim 9, wherein the adhesive is a curable liquid.

12. The joint as claimed in claim 1, wherein the adhesive is a curable liquid.

13. The joint as claimed in claim 1, wherein the voids are interconnected to each other.

* * * * *